United States Patent
Suh

(10) Patent No.: US 8,299,582 B2
(45) Date of Patent: Oct. 30, 2012

(54) SUBSTRATE FOR SEMICONDUCTOR PACKAGE AND SEMICONDUCTOR PACKAGE HAVING THE SAME

(75) Inventor: Min Suk Suh, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 411 days.

(21) Appl. No.: 12/261,156

(22) Filed: Oct. 30, 2008

(65) Prior Publication Data

US 2010/0052109 A1    Mar. 4, 2010

(30) Foreign Application Priority Data

Aug. 29, 2008  (KR) ........................ 10-2008-0085389

(51) Int. Cl.
*H01L 29/40*  (2006.01)
(52) U.S. Cl. ........ 257/621; 257/690; 257/692; 257/734; 257/773; 257/774
(58) Field of Classification Search ................ 257/621, 257/678, 690, 692, 698, 734, 738, 773, 774
See application file for complete search history.

(56) References Cited

U.S. PATENT DOCUMENTS

| | | | |
|---|---|---|---|
| 6,825,682 B2 * | 11/2004 | Kantz et al. ................ | 324/750.3 |
| 2003/0047809 A1 * | 3/2003 | Takeuchi et al. ............. | 257/758 |
| 2005/0000725 A1 * | 1/2005 | Shiraishi et al. ............. | 174/255 |

FOREIGN PATENT DOCUMENTS

| | | |
|---|---|---|
| KR | 10-0253390 B1 | 1/2000 |
| KR | 1020030057191 A | 7/2003 |
| KR | 10-0621438 B1 | 8/2006 |

OTHER PUBLICATIONS

Machine Translation of IDS Ref. #10-2003-0057191.*

* cited by examiner

*Primary Examiner* — Anh Mai
*Assistant Examiner* — Suberr Chi
(74) *Attorney, Agent, or Firm* — Ladas & Parry LLP

(57) ABSTRACT

A semiconductor package includes a substrate including a substrate body having a first face and a second face opposing the first face. A first through electrode passes through the substrate body between the first face and the second face. An insulation member is disposed over the first face; and a connection member having a first conductive unit disposed inside of the insulation member is electrically connected to the first through electrode, and a second conductive unit electrically connected to the first conductive unit is exposed at side faces of the insulation member. A semiconductor chip having third and fourth faces is disposed over the first face of the substrate body in a vertical direction. A second through electrode passes through the substrate body between the third and fourth faces and is electrically connected to the second conductive unit.

19 Claims, 4 Drawing Sheets

US 8,299,582 B2

SUBSTRATE FOR SEMICONDUCTOR PACKAGE AND SEMICONDUCTOR PACKAGE HAVING THE SAME

CROSS-REFERENCE TO RELATED APPLICATIONS

The present application claims priority to Korean patent application number 10-2008-0085389 filed on Aug. 29, 2008, which is incorporated herein by reference in its entirety.

BACKGROUND OF THE INVENTION

The present invention relates generally to semiconductor packages, and more particularly to a substrate for a semiconductor package and a semiconductor package having the same.

Nowadays, semiconductor chips capable of storing massive data in a short processing time and semiconductor packages having such semiconductor chips packaged therein are being developed.

To enhance the data storing capacity and/or the data processing speed of a semiconductor package, a semiconductor package having a plurality of electrically interconnected semiconductor packages stacked on a substrate is also being developed.

When semiconductor packages are stacked into a single semiconductor package unit, problems hindering high-speed operations could arise in the single semiconductor package unit due to the different signal path lengths between any respective combination of the stacked semiconductor packages in the single semiconductor package unit.

SUMMARY OF THE INVENTION

Embodiments of the present invention are directed to a substrate for a semiconductor package which reduces the difference in the path lengths of signals applied to a plurality of semiconductor chips thereby enhancing operation properties.

Also, embodiments of the present invention are directed to a semiconductor package which includes a substrate for a semiconductor package that enhances the operation properties of semiconductor chips.

In one embodiment, a substrate for a semiconductor package includes a substrate body having a first face and a second face opposing the first face; a through electrode passing through the substrate body between the first face and the second face; an insulation member with a block shape disposed over the first face; and a connection member having a first conductive unit disposed inside of the insulation member and electrically connected to the through electrode and a second conductive unit electrically connected to the first conductive unit and exposed at both side faces of the insulation member.

The substrate body may include a semiconductor chip having a circuit unit and a bonding pad electrically connected with the through electrode.

Alternatively, the substrate body may include a printed circuit board.

The substrate for a semiconductor package may further include a conductive ball disposed over the second face of the substrate body and electrically connected to the through electrode.

The substrate for a semiconductor package may further include an additional connection member disposed at an end portion of the second conductive unit exposed from the insulation member.

The insulation member includes a first insulation unit and a second insulation unit disposed over the first insulation unit, the first conductive unit passes through the first insulation unit, and the second conductive unit is disposed over the first insulation unit.

The first conductive unit is disposed vertically to the first face and the second conductive unit is disposed parallel to the first face.

In another embodiment, a semiconductor package includes a substrate having a substrate body with a first face and a second face opposing the first face, a first through electrode passing through the substrate body between the first face and the second face; an insulation member with a block shape disposed over the first face, and a connection member having a first conductive unit disposed inside of the insulation member and electrically connected to the first through electrode and a second conductive unit electrically connected to the first conductive unit and exposed from both side faces of the insulation member; and a semiconductor chip having third and fourth faces disposed over the first face of the substrate body vertically to the first face and being opposite to each other, and a second through electrode passing through the semiconductor chip between the third and fourth faces and electrically connected to the second conductive unit exposed from the side face of the insulation member.

The substrate body includes one of a semiconductor chip having a circuit unit and a bonding pad electrically connected to the first through electrode, and a printed circuit board.

The substrate body includes a conductive ball disposed over the second face of the substrate body and electrically connected to the first through electrode.

The semiconductor package may further include an additional connection member for electrically connecting the second through electrode and the second conductive unit.

The insulation member includes a first insulation unit and a second insulation unit disposed over the first insulation unit, the first conductive unit passes through the first insulation unit, and the second conductive unit is disposed over the first insulation unit.

The semiconductor package may further include a sealing member for sealing the semiconductor chip.

The semiconductor package may further include an adhesive member interposed between a side face of the semiconductor chip and the first face so as to attach the semiconductor chip onto the first face.

At least two semiconductor chips are disposed over the first face, and the semiconductor chips are of the same kind of semiconductor chips.

Alternatively, at least two semiconductor chips are disposed over the first face, and the semiconductor chips are of different kind of semiconductor chips.

DESCRIPTION OF SPECIFIC EMBODIMENTS

Figure 1:
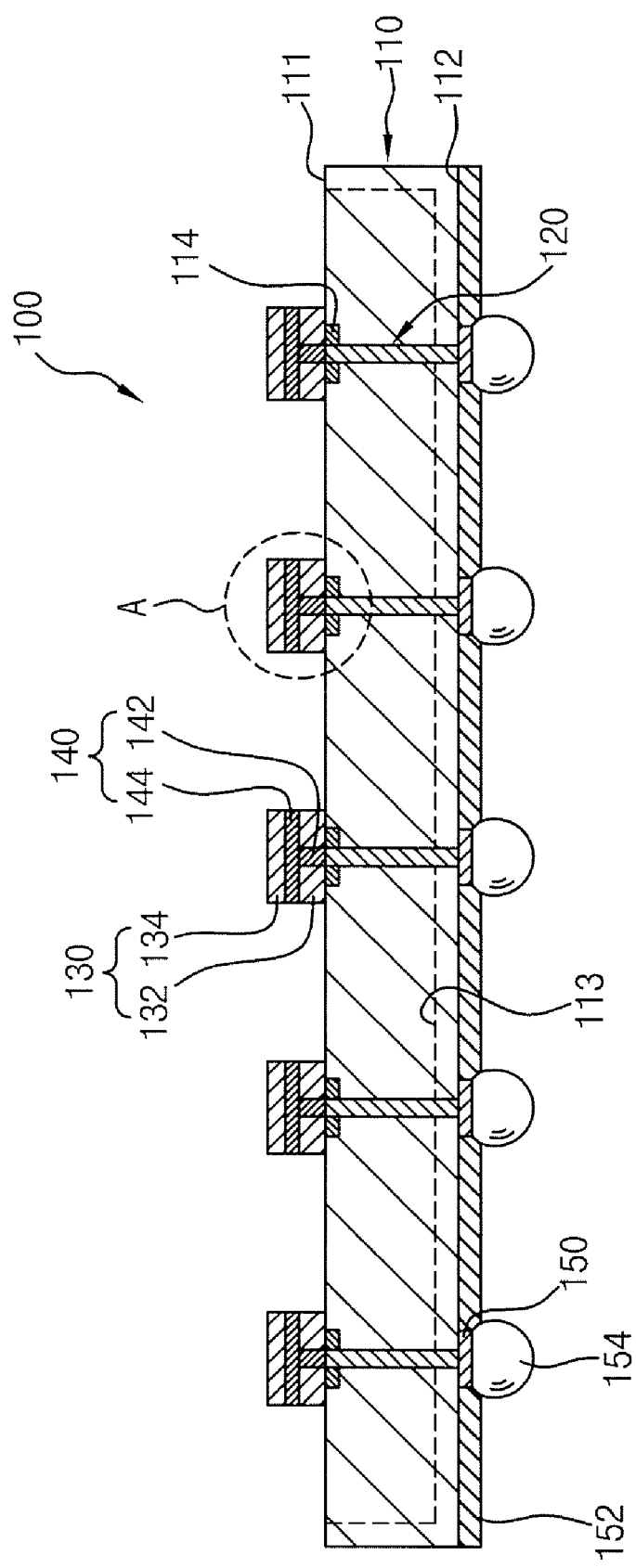
FIG. 1 is a cross-sectional view showing a substrate for a semiconductor package in accordance with an embodiment of the present invention.
Figure 2:
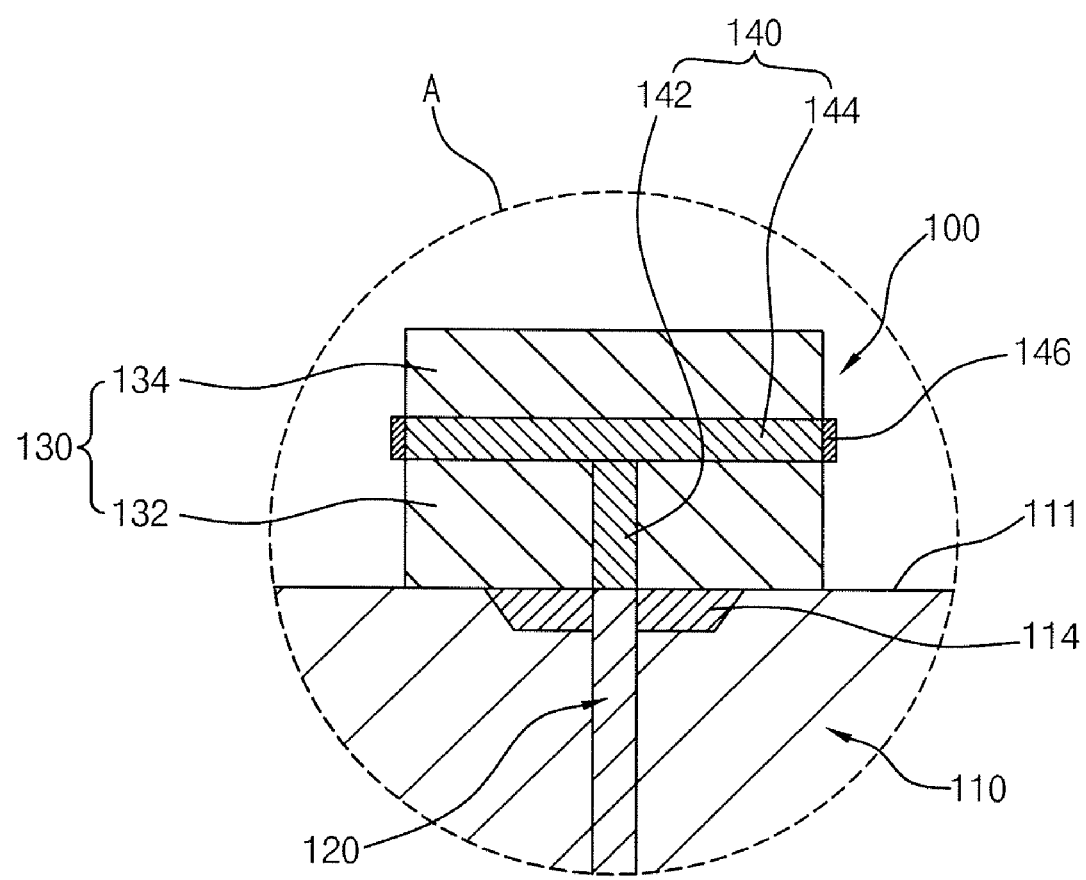
FIG. 2 is an enlarged view of a portion 'A' in FIG. 1.

FIG. 1 is a cross-sectional view showing a substrate 100 for a semiconductor package in accordance with an embodiment of the present invention. FIG. 2 is an enlarged view of a portion 'A' of the substrate 100 shown in FIG. 1.

Referring to FIGS. 1 and 2, the substrate 100 for a semiconductor package includes a substrate body 110, a through electrode 120, an insulation member 130, and a connection member 140.

The substrate body 110 is a planar layer (for example, a plate shape with a rectangular parallelepiped shape) having a first face 111 and a second face 112 opposing the first face 111.

In the present embodiment, the substrate body 110 is a semiconductor chip having a circuit unit 113 and bonding pads 114.

The circuit unit 113 may include a data storing unit (not shown) for storing data and/or a data processing unit (not shown) for processing the data. The bonding pads 114 may be disposed, for example, on the first face 111 of the substrate body 110, and the bonding pads 114 are electrically connected to the circuit unit 113.

Although the substrate body 110 is shown and described as a semiconductor chip in the present embodiment, the substrate body 110 may be a printed circuit board (PCB) having a circuit wiring or a bare substrate having no circuit wiring. When the substrate body 110 is a PCB, the substrate body 110 would include electric elements and/or passive elements such as a transistor, a diode, an inductor, etc.

The through electrode 120 passes through the substrate body 110 between the first face 111 and the second face 112. In the present embodiment, a plurality of the through electrodes 120 is arranged along a line or in a row of electrodes in the substrate body 110. In the present embodiment, the through electrode 120 is electrically connected to the circuit unit 113. For example, in the exemplary embodiment shown in FIG. 1, the through electrode 120 is electrically connected to the bonding pad 114 electrically connected to the circuit unit 113. In the present embodiment shown in FIG. 1, the through electrode 120 passes through the bonding pad 114, and the through electrode 120 and the bonding pad 114 are thereby electrically connected. In an alternative embodiment, the through electrode 120 may be spaced a predetermined distance from the bonding pad 114, and the through electrode 120 and the bonding pad 114 corresponding to the through electrode 120 may be electrically connected by a redistribution (not shown).

In the present embodiment, the through electrode 120 includes, for example, copper having excellent electrical conductive properties; however, the through electrode 120 is not limited to only copper.

The insulation member 130 is disposed, for example, over the first face 111 of the substrate body 110. In the present embodiment, a plurality of insulation members 130 are disposed over the first face 111 of the substrate body 110 with each insulation member 130 corresponding to a through electrode. The insulation member 130 includes an insulation material, and the insulation member 130 including the insulation material has a block shape. For example, the insulation member 130 may have the shape of rectangular column disposed along the first face 111 of the substrate body 110. Each insulation member 130 covers one end of the corresponding through electrode 120 exposed at the first face 111.

The insulation member 130 includes a first insulation unit 132 and a second insulation unit 134. The first insulation unit 132 is disposed on the first face 111 of the substrate body 110 and the second insulation unit 134 is disposed on the first insulation unit 132. In the present embodiment, the first insulation unit 132 and the second insulation unit 134 may have the same insulation material. Alternatively, the first insulation unit 132 and the second insulation unit 134 may have different insulation materials.

The connection member 140 is disposed inside of the insulation member 130. The connection member 140 includes a first conductive unit 142 and a second conductive unit 144.

The first conductive unit 142 passes through the first insulation member 132 of the insulation member 130 between an upper face of the first insulation unit 132 and a lower face of the first insulation unit 132 opposing the upper face. An end portion of the first conductive unit 142 is electrically connected to the corresponding through electrode 120 of the through electrodes 120 arranged in a row. The first conductive unit 142 may be formed in a direction substantially vertical to the first face 111 of the substrate body 110. In the present embodiment, the first conductive unit 142 may be a plated pattern or a metal pin.

The second conductive unit 144 is disposed over the upper face of the first insulation unit 132, and the second conductive unit 144 is electrically connected to the first conductive unit 142. The second conductive unit 144 may be formed in a direction parallel to the first face 111 of the substrate body 110. In the present embodiment, the second conductive unit 144 may be a plated pattern or a metal pin. In the embodiment of the present invention shown in FIG. 1, respective end portions of the second conductive unit 144 are exposed at two side faces of the insulation member 130.

Referring to FIG. 2, the additional connection members 146 are disposed on both end portions of the second conductive unit 144 exposed at the respective side faces of the insulation member 130. In the present embodiment, the additional connection members 146 may include, for example, a low melting point metal such as a solder. In an embodiment of the present invention, the additional connection member 146 may be disposed not only on the second conductive unit 144, but also on the end portion of the first conductive unit connected to the through electrode 120.

Referring again to FIG. 1, the substrate 100 for a semiconductor package may further include redistributions 150, solder resist patterns 152, and conductive balls 154.

The redistributions 150 are disposed over the second face 112 of the substrate body 110, and each redistribution 150 is electrically connected to a respective through electrode 120.

The solder resist patterns 152 are disposed on the second face 112 of the substrate 110 and cover the respective redistributions 150. The solder resist pattern 152 includes an opening that exposes some of the redistribution 150.

The conductive ball 154 is attached to the redistribution 150 exposed by the opening of the solder resist pattern 152. The conductive ball 154 may include a low melting point metal such as a solder.

Figure 3:
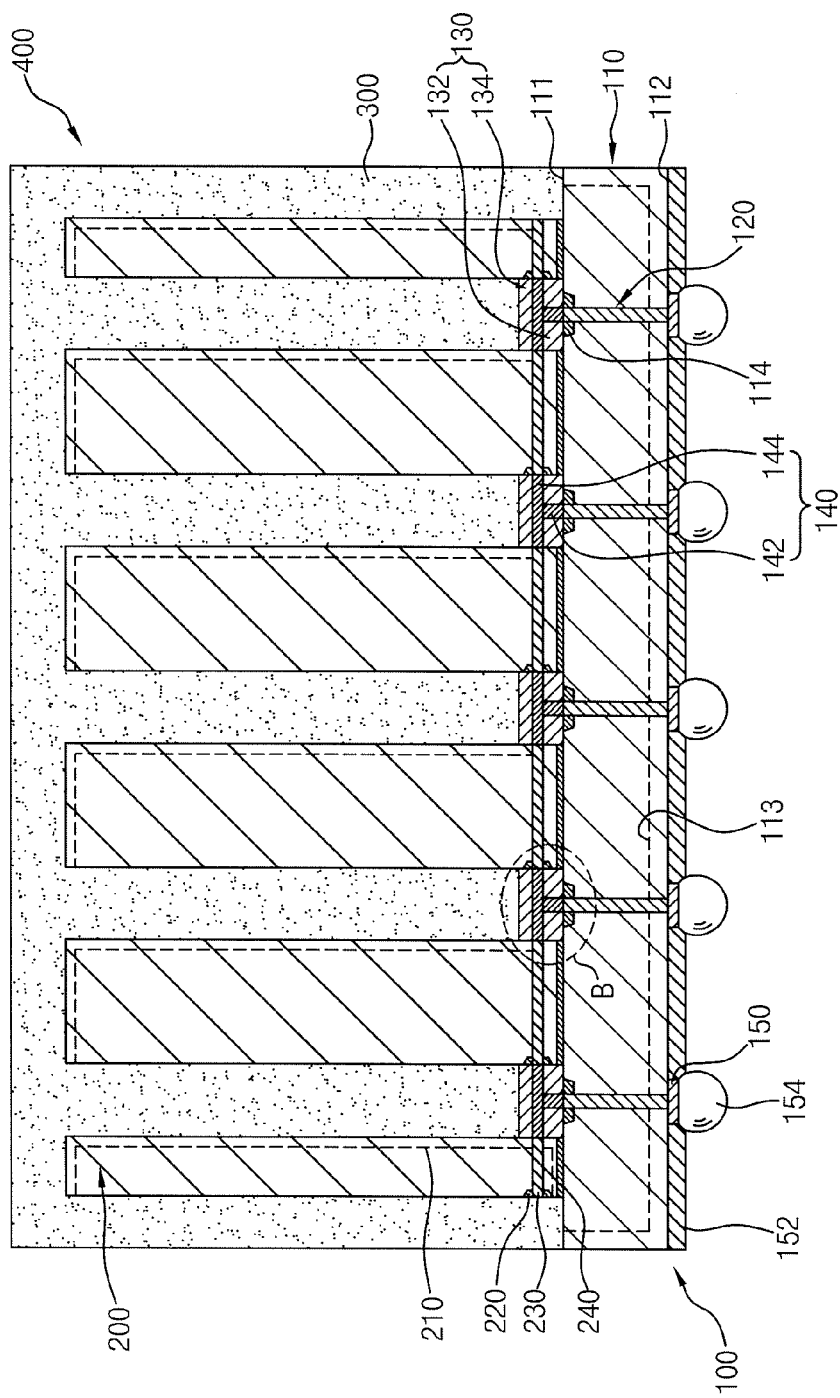
FIG. 3 is a cross-sectional view of a semiconductor package in accordance with an embodiment of the present invention.
Figure 4:
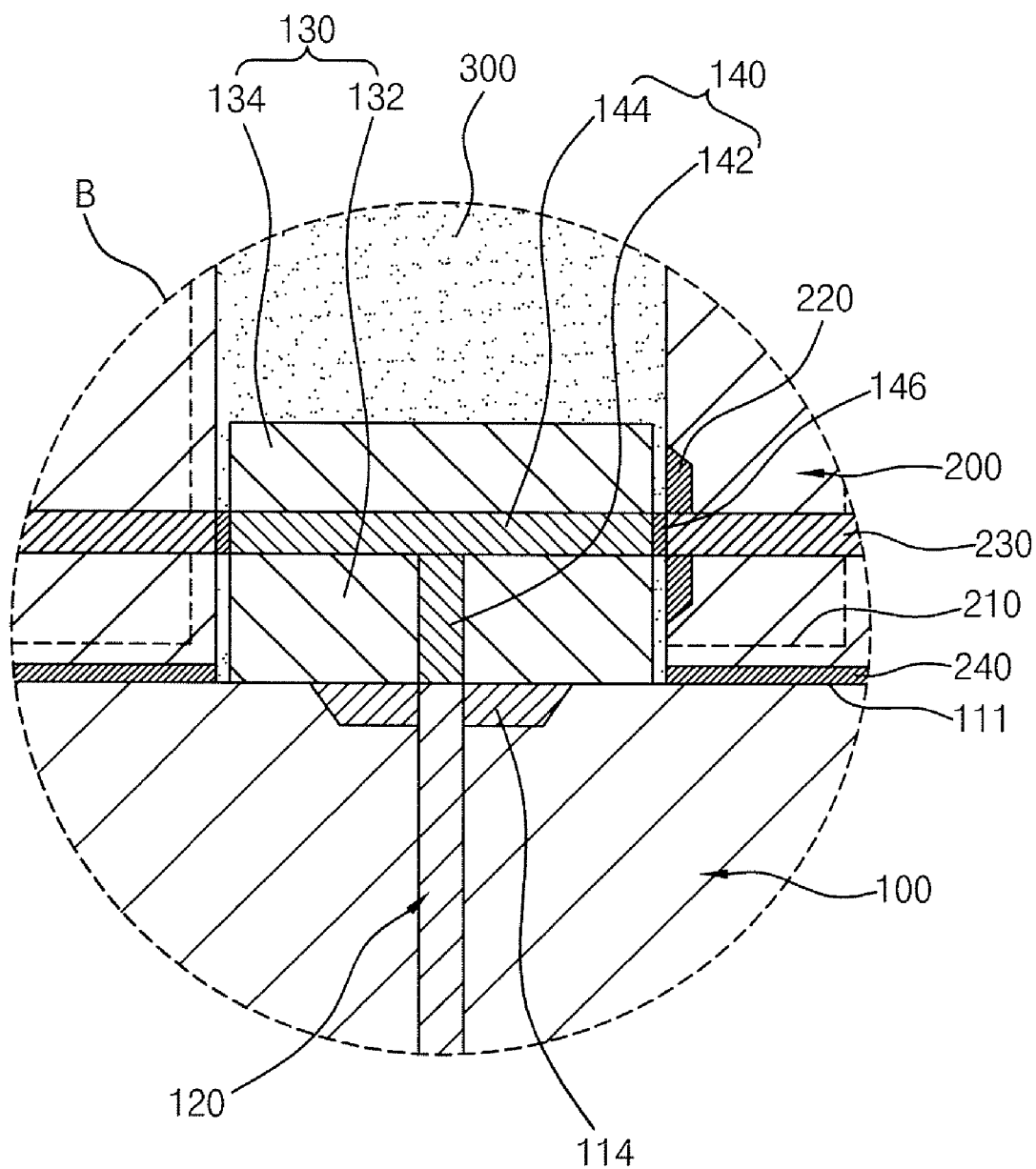
FIG. 4 is an enlarged view of a portion 'B' in FIG. 3.

FIG. 3 is a cross-sectional view showing a semiconductor package in accordance with an embodiment of the present invention. FIG. 4 is an enlarged view of portion 'B' in FIG. 3.

Referring to FIGS. 3 and 4, a semiconductor package 400 includes a substrate 100 and semiconductor chips 200.

The substrate 100 includes a substrate body 110, a first through electrode 120, an insulation member 130 and a connection member 140.

The substrate body 110 may have, for example, a plate shape with a rectangular parallelepiped shape, and the substrate body 110 includes a first face 111 and a second face 112 opposing the first face 111.

The substrate body 110 is, for example, a semiconductor chip having a circuit unit 113 and bonding pads 114.

The circuit unit 113 may include a data storing unit (not shown) for storing data and/or a data processing unit (not shown) for processing the data. The bonding pads 114 may be disposed, for example, on the first face 111 of the substrate body 110, and the bonding pad 114 is electrically connected to the circuit unit 113.

Although the substrate body 110 is shown and described as a semiconductor chip in the present embodiment, the substrate body 110 may be a PCB having circuit wiring or a bare substrate having no circuit wiring.

The first through electrode 120 passes through the substrate body 110 between the first face 111 and the second face 112. In the present embodiment, a plurality of the first through electrodes 120 may be arranged along a line or in a row of electrodes in the substrate body 110.

In the present embodiment, the first through electrode 120 is electrically connected to the circuit unit 113. For example, in the exemplary embodiment shown in FIG. 3, the first through electrode 120 is electrically connected to the bonding pad 114 electrically connected to the circuit unit 113. In the present embodiment shown in FIG. 3, the first through electrode 120 passes through the bonding pad 114, and the first through electrode 120 and the bonding pad 114 corresponding to the first through electrode 120 are thereby electrically connected. In an alternative embodiment, the first through electrode 120 may be spaced a predetermined distance from the bonding pad 114, and the first through electrode 120 and the bonding pad 114 corresponding to the first through electrode 120 may be electrically connected to each other by a redistribution (not shown).

In the present embodiment, the first through electrode 120 includes, for example, copper having excellent electrical conductive properties; however, the first through electrode 120 is not limited to only copper.

The insulation member 130 is disposed, for example, over the first face 111 of the substrate body 110. The insulation member 130 includes an insulation material, and the insulation member 130 including the insulation material has a block shape. In the present embodiment, the insulation member 130 may have the shape of rectangular column disposed along the first face 111 of the substrate body 110. Each insulation member 130 covers one end of the corresponding first through electrode 120 exposed at the first face 111.

The insulation member 130 includes a first insulation unit 132 and a second insulation unit 134. The first insulation unit 132 is disposed on the first face 111 of the substrate body 110 and the second insulation unit 134 is disposed on the first insulation unit 132. In the present embodiment, the first insulation unit 132 and the second insulation unit 134 may have the same insulation material. Alternatively, the first insulation unit 132 and the second insulation unit 134 may have different insulation materials.

In embodiments of the present invention, a plurality of insulation members 130 can be disposed over the first face 111 of the substrate body 110. FIG. 3 shows an exemplary embodiment in which five insulation members 130 are disposed over the first face 111 of the substrate body 110 with each insulation member 130 being formed on a first through electrode 120.

The connection member 140 is disposed inside of the insulation member 130. The connection member 140 includes a first conductive unit 142 and a second conductive unit 144.

The first conductive unit 142 passes through the first insulation unit 132 of the insulation member 130 between an upper face of the first insulation unit 132 and a lower face of the first insulation unit 132 opposing the upper face. An end portion of the first conductive unit 142 is electrically connected to the corresponding first through electrode 120 of the first through electrodes 120 arranged in a row. The first conductive unit 142 may be formed in a direction substantially vertical to the first face 111 of the substrate body 110.

The second conductive unit 144 is disposed over the upper face of the first insulation unit 132, and the second conductive unit 144 is electrically connected to the first conductive unit 142. The second conductive unit 144 may be formed in a direction parallel to the first face 111 of the substrate body 110. In the embodiment of the present invention shown in FIG. 3, respective end portions of the second conductive unit 144 are exposed at two side faces of the insulation member 130.

Referring to FIG. 4, the additional connection members 146 are disposed on both end portions of the second conductive unit 144 exposed at the respective side faces of the insulation member 130. In the present embodiment, the additional connection members 146 may include, for example, a low melting point metal such as a solder. In an embodiment of the present invention, the additional connection member 146 may be disposed not only on the second conductive unit 144, but also on the end portion of the first conductive unit connected to the first through electrode 120.

Referring to FIG. 3, the substrate 100 may further include redistributions 150, solder resist patterns 152, and conductive balls 154.

The redistributions 150 are disposed over the second face 112 of the substrate body 110 and each redistribution 150 is electrically connected to a respective first through electrodes 120.

The solder resist patterns 152 are disposed on the second face 112 of the substrate 110 and cover the respective redistributions 150. The solder resist pattern 152 includes an opening that exposes some of the redistribution 150.

The conductive ball 154 is attached to the redistribution 150 exposed by the opening of the solder resist pattern 152. The conductive ball 154 may include a low melting point metal such as a solder.

The semiconductor chips 200 shown in FIG. 3 may have, for example, a rectangular parallelepiped shape. In the present embodiment, the thickness of the semiconductor chip 200 is substantially the same as the space between neighboring insulation members 130 disposed over the first face 111 of the substrate 100.

In one embodiment of the present invention, the semiconductor chips 200 disposed over the first face 111 of the substrate 100 may be of the same kind of semiconductor chip. In an alternative embodiment, the respective semiconductor chips 200 disposed over the first face 111 of the substrate 100 may be different kinds of semiconductor chips.

Each semiconductor chip 200 includes a circuit unit 210, a bonding pad 220, and a second through electrode 230.

The circuit unit 210 of the semiconductor chip 200 may include a data storing unit (not shown) for storing data and a data processing unit (not shown) for processing the data.

The bonding pad 220 may be disposed towards an edge of a surface of the respective semiconductor chip 200. In the present embodiment shown in FIG. 3, the respective bonding pads 220 are disposed at a position corresponding to the second conductive units 144 of the connection members 140 disposed inside of the insulation member 130. Alternatively, the respective bonding pads 220 may be disposed in the middle of the semiconductor chip 200, and the respective bonding pads 220 may be electrically connected to one end of a redistribution (not shown). The redistribution then extends to an edge of the semiconductor chip 200 and the other end of the redistribution is electrically connected to the bonding pad 220. As such, the respective redistributions are disposed at a position corresponding to the second conductive unit 144 of the connection member 140 disposed inside of the insulation member 130.

The second through electrode 230 is electrically connected to the circuit unit 210, and the second through electrode 230 is disposed at a position allowing the second through electrode 230 to be electrically connected to the second conductive unit 144. That is, the second through electrode 230 extends within the semiconductor chip between the insulation members 130 of the substrate 100. In the present embodiment, the second through electrode 230 may include copper having excellent conductive properties.

In the present embodiment, an adhesive member 240 is disposed on a side face of the semiconductor chip that is adjacent to the bonding pad 220 and facing the substrate 100. The adhesive member 240 may be, for example, a double-sided adhesive tape or an adhesive agent.

The semiconductor chip 200 is inserted between the insulation members 130 disposed over the first face 111 of the substrate 100 such that the side face on which the adhesive member 240 is disposed faces the first face 111 of the substrate 100, and the semiconductor chip 200 is attached onto the first face 111 of the substrate 100 by the adhesive member 240. Therefore, the second through electrode 230 of a semiconductor chip 200 is electrically connected to the second conductive unit 144 exposed at the side face of the corresponding insulation member 130. At this time, the second conductive unit 144 and the second through electrode 230 corresponding to the second conductive unit 144 are electrically connected to each other by the additional connection member 146.

After the semiconductors 200 are disposed on the first face 111 of the substrate 100, a sealing member 300 is formed over the semiconductor chips 200 to electrically insulate the semiconductor chips 200 from each other. Examples of a sealing member 300 include an epoxy resin, etc.

As is apparent from the above embodiment, when the semiconductor chips 200 are electrically connected using the insulation members 130 and the connection members 140 disposed over the first face 111 of the substrate 100, paths of signals applied to the respective semiconductor chips 200 are shortened and deviation in the signal path length is notably reduced. Therefore, it is possible to notably enhance operation properties of the semiconductor chips 200.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A substrate for a semiconductor package, comprising:
   a substrate body having a first face and a second face opposing the first face; a through electrode passing through the semiconductor body between the first face and the second face;
   an insulation member disposed on the first face; and a connection member comprising:
   a first conductive unit disposed inside of the insulation member and electrically connected to the through electrode; and
   a second conductive unit electrically connected to the first conductive member and exposed at a side face of the insulation member, and
   wherein the second conductive unit is directly exposed, wherein the insulation member comprises a first insulation unit and a second insulation unit disposed on the first insulation unit, the first conductive unit passes through the first insulation unit, and the second conductive unit is disposed over the first insulation unit, and
   wherein the insulation member and the substrate body are separate and distinct from each other.

2. The substrate for a semiconductor package according to claim 1, wherein the substrate body comprises a semiconductor chip having a circuit unit and a bonding pad electrically connected to the through electrode.

3. The substrate for a semiconductor package according to claim 1, wherein the substrate body comprises a printed circuit board.

4. The substrate for a semiconductor package according to claim 3, wherein the substrate body comprises at least one of a transistor, a diode, a resistor, and an inductor.

5. The substrate for a semiconductor package according to claim 1, further comprising:
   a conductive ball disposed on the second face of the substrate body and electrically connected to the through electrode.

6. The substrate for a semiconductor package according to claim 1, further comprising:
   a connection member disposed on the portion of the second conductive.

7. The substrate for a semiconductor package according to claim 1,
   wherein the first conductive unit extends through a portion of the insulation member in a direction perpendicular to the first face and the second conductive unit is disposed parallel to the first face.

8. The substrate for a semiconductor package according to claim 1, wherein:
   the insulation member has a block shape,
   the first conductive unit extends through a portion of the insulation member in a direction substantially perpendicular to the first face,
   the second conductive unit extends through the insulation member in a direction parallel to the first face such that the second conductive unit is exposed at two side faces of the insulation member opposite to each other.

9. A substrate for a semiconductor package, comprising:
   a substrate body having a first face and a second face opposing the first face, wherein the substrate body comprises a semiconductor chip having a circuit unit and a bonding pad electrically connected to the through electrode;
   a through electrode passing through the substrate body between the first face and the second face;
   an insulation member disposed on the first face; and
   a connection member comprising:
   a first conductive unit disposed inside of the insulation member and electrically connected to the through electrode; and
   a second conductive unit electrically connected to the first conductive unit and directly exposed at a side face and an opposing side face of the side face of the insulation member, and
   wherein the insulation member and the substrate body are separate and distinct from each other.

10. The substrate for a semiconductor package according to claim 9, further comprising: a conductive ball disposed on the second face of the substrate body and electrically connected to the through electrode.

11. The substrate for a semiconductor package according to claim 9, further comprising: an additional connection member disposed on the portion of the second conductive unit exposed at the side face of the insulation member.

12. The substrate for a semiconductor package according to claim 9, wherein: the insulation member comprises a first insulation unit and a second insulation unit disposed on the first insulation unit, the first conductive unit passes through the first insulation unit, and the second conductive unit is disposed over the first insulation unit.

13. The substrate for a semiconductor package according to claim 9, wherein the first conductive unit extends through a portion of the insulation member in a direction vertical to the first face and the second conductive unit is disposed parallel to the first face.

14. The substrate for a semiconductor package according to claim 9, wherein: the insulation member has a block shape, the first conductive unit extends through a portion of the insulation member in a direction substantially vertical to the first face, the second conductive unit extends through the insulation member in a direction parallel to the first face such that the second conductive unit is directly exposed at the side face and the opposing side face of the side face of the insulation member opposite to each other.

15. A substrate for a semiconductor package, comprising:
a substrate body having a first face and a second face opposing the first face, wherein the substrate body comprises a semiconductor chip having a circuit unit and a bonding pad electrically connected to the through electrode;
a through electrode passing through the substrate body between the first face and the second face;
an insulation member disposed on the first face; and
a connection member comprising:
a first conductive unit disposed inside of the insulation member and electrically connected to the through electrode; and
a second conductive unit electrically connected to the first conductive unit and directly exposed at a side face and an opposing side face of the side face of the insulation member, wherein the insulation member comprises a first insulation unit and a second insulation unit disposed on the first insulation unit, the first conductive unit passes through the first insulation unit, and the second conductive unit is disposed over the first insulation unit.

16. The substrate for a semiconductor package according to claim 15, further comprising: a conductive ball disposed on the second face of the substrate body and electrically connected to the through electrode.

17. The substrate for a semiconductor package according to claim 15, further comprising: an additional connection member disposed on the portion of the second conductive unit directly exposed at the side face and the opposing side face of the side face of the insulation member.

18. The substrate for a semiconductor package according to claim 15, wherein the first conductive unit extends through a portion of the insulation member in a direction vertical to the first face and the second conductive unit is disposed parallel to the first face.

19. The substrate for a semiconductor package according to claim 15, wherein: the insulation member has a block shape, the first conductive unit extends through a portion of the insulation member in a direction substantially vertical to the first face, the second conductive unit extends through the insulation member in a direction parallel to the first face such that the second conductive unit is directly exposed at the side face and the opposing side face of the side face of the insulation member opposite to each other.

* * * * *